(12) United States Patent
Jensen et al.

(10) Patent No.: US 8,280,324 B2
(45) Date of Patent: Oct. 2, 2012

(54) METHOD AND SYSTEM FOR CLOSED LOOP POWER CONTROL IN WIRELESS SYSTEMS

(75) Inventors: Henrik Jensen, Long Beach, CA (US); Philippe Riondet, Irvine, CA (US); Eric Raith, Dana Point, CA (US); Hooman Darabi, Irvine, CA (US); Paul Lettieri, Lake Forest, CA (US); Louie Serrano, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 516 days.

(21) Appl. No.: 12/351,733

(22) Filed: Jan. 9, 2009

(65) Prior Publication Data

US 2009/0264091 A1 Oct. 22, 2009

Related U.S. Application Data

(60) Provisional application No. 61/045,650, filed on Apr. 17, 2008.

(51) Int. Cl.
*H01Q 11/12* (2006.01)
(52) U.S. Cl. .......... 455/126; 455/127.1; 455/245.1; 455/522; 375/296; 375/297; 375/135; 375/136; 375/376; 330/127; 330/129
(58) Field of Classification Search .......... 455/126, 455/127.1–127.3, 114.3, 115.1, 115.3, 108, 455/110, 245.1, 522; 375/295, 296, 297, 375/300, 302, 320, 135, 136, 376; 330/127–142, 278–280, 282, 291–293
See application file for complete search history.

(56) References Cited

U.S. PATENT DOCUMENTS

| 6,633,199 | B2 * | 10/2003 | Nielsen et al. ............... 330/129 |
| 7,415,254 | B2 * | 8/2008 | Kuriyama et al. .......... 455/127.2 |
| 7,471,935 | B2 * | 12/2008 | Barak et al. ............... 455/127.2 |
| 7,519,337 | B2 * | 4/2009 | Ito et al. .................... 455/127.3 |
| 2005/0110566 | A1 * | 5/2005 | Bhattacharjee et al. ...... 330/140 |
| 2009/0156143 | A1 * | 6/2009 | Shute ........................ 455/127.2 |
| 2009/0245417 | A1 * | 10/2009 | Kadous et al. ............... 375/297 |

* cited by examiner

*Primary Examiner* — Junpeng Chen
(74) *Attorney, Agent, or Firm* — Sterne, Kessler, Goldstein & Fox P.L.L.C.

(57) ABSTRACT

Aspects of a method and system for closed loop power control in wireless systems are provided. In this regard, an output power of an amplifier may be measured and an indication of the measured power may be compared to a reference signal. The results of the comparison are utilized to generate an error correction factor. The gain of a preamplifier may be adjusted utilizing the error correction factor, where the output of the preamplifier may be input to the amplifier. The error correction factor may be generated via a proportional integral derivative controller. The gain of the preamplifier may be adjusted via at least one control signal, where the at least one control signal may be generated based on a reference control word and the error correction factor. The indication of the measured power and the reference signal may be time aligned.

20 Claims, 8 Drawing Sheets

METHOD AND SYSTEM FOR CLOSED LOOP POWER CONTROL IN WIRELESS SYSTEMS

CROSS-REFERENCE TO RELATED APPLICATIONS/INCORPORATION BY REFERENCE

This patent application makes reference to, claims priority to and claims benefit from U.S. Provisional Patent Application Ser. No. 61/045,650 filed on Apr. 17, 2008.

The above stated application is hereby incorporated herein by reference in its entirety.

FIELD OF THE INVENTION

Certain embodiments of the invention relate to cellular communications. More specifically, certain embodiments of the invention relate to a method and system for closed loop power control in wireless systems.

BACKGROUND OF THE INVENTION

The rapidly increasing dependence on wireless communications continues to push system designers to make wireless communication devices that operate more reliably even in the presence of ever increasing noise and interference. In this regard, the increasing number of wireless devices in operation and the increasing number of wireless communication standards in use is causing significant congestion of the airwaves. Moreover, users of wireless communication devices are demanding greater functionality and increased coverage areas as they become more dependant on wireless communications for both work and play.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided closed loop power control in wireless systems, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for closed loop power control in wireless systems. In various embodiments of the invention, an output power of an amplifier may be measured and an indication of the measured power may be compared to a reference signal to generate an error correction factor. The gain of a preamplifier may be adjusted utilizing the error correction factor, where the output of the preamplifier may be input to the amplifier. The error correction factor may be generated via a proportional integral derivative (PID) controller. The gain of the preamplifier may be adjusted via at least one control signal, where the at least one control signal may be generated based on a reference control word and the error correction factor. The indication of the measured power and the reference signal may be time aligned. The time alignment may be achieved by delaying one or both of the reference signal and the indication of the measured power. The gain of the preamplifier may be adjusted via two gain terminals. The output of the preamplifier may be amplitude modulated via one of the two gain control terminals. The reference signal may be ramped up during a first portion of a transmit time slot and ramped down during a second portion of a transmit time slot. The error correction factor may be generated during a first transmit time slot and utilized to adjust the gain of the preamplifier during a subsequent time slot. A signal that amplitude modulates the output of the preamplifier may be scaled to adjust the gain of the preamplifier.

Figure 1:
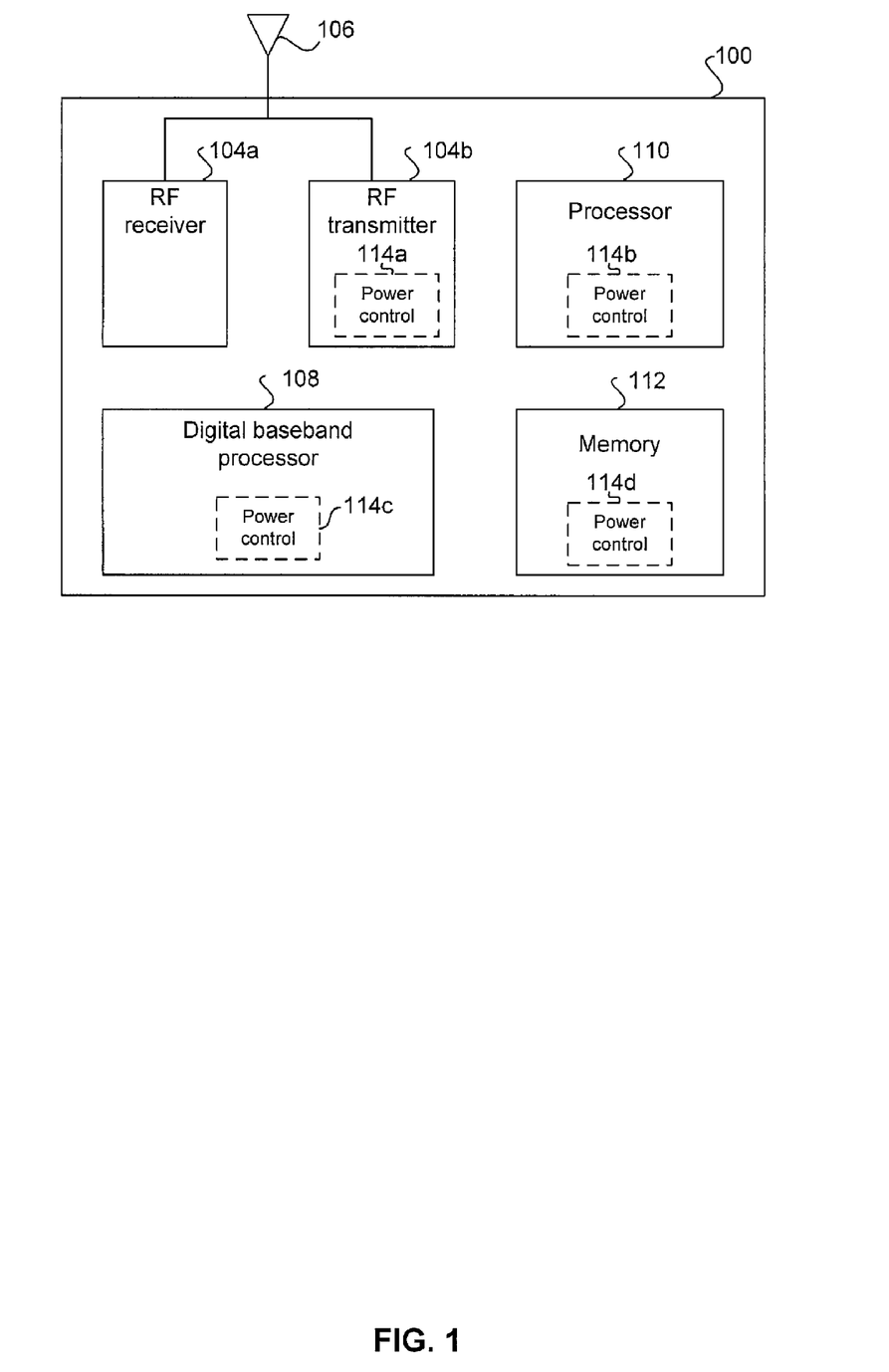
FIG. 1 is a block diagram illustrating an exemplary wireless communication device, in accordance with an embodiment of the invention.

FIG. 1 is a block diagram illustrating an exemplary wireless communication device, in accordance with an embodiment of the invention. Referring to FIG. 1, there is shown a wireless communication device 100, an RF receiver 104a, an RF transmitter 104b, an antenna 106, a digital baseband processor 108, a processor 110, a memory 112, and power control module 114.

The wireless communication device 100 may comprise the RF receiver 104a, the RF transmitter 104b, the antenna 106, the digital baseband processor 108, the processor 110, the memory 112, and may also comprise additional suitable logic, circuitry, and/or code that may be operable to receive, transmit, and/or process RF signals. For example, the wireless communication device 100 may be operable to communicate over a cellular network in accordance with one or more cellular standards such as global system for mobile communications (GSM) and enhanced data rates for GSM evolution (EDGE).

The antenna 106 may comprise suitable logic, circuitry, and/or code that may enable transmission and/or reception of RF signals. The antenna 106 may be communicatively coupled to the RF receiver 104a and the RF transmitter 104b. In various embodiments of the invention, the antenna may comprise separate receive and/or transmit antenna elements.

The RF receiver 104a may comprise suitable logic, circuitry, and/or code that may be operable to process received RF signals. The RF receiver 104a may be operable to down-convert received RF signals to a baseband frequency signal. The RF receiver 104a may be operable to perform direct down-conversion of the received RF signals to a baseband frequency signal, for example. In some instances, the RF receiver 104a may be operable to convert baseband signal components from analog to digital before transferring the components to the digital baseband processor 108. In other instances, the RF receiver 104a may be operable to transfer the baseband signal components in analog form. In various embodiments of the invention, the RF receiver 104a may be operable to receive cellular signals in accordance with cellular standards such as GSM and/or EDGE. In this regard, the RF receiver 104a may be operable to generate signals, such as local oscillator signals, for the reception and processing of cellular signals.

The RF transmitter 104b may comprise suitable logic, circuitry, and/or code that may be operable to process RF signals for transmission. The RF transmitter 104b may be operable to up-convert the baseband frequency signal to an RF signal. The RF transmitter 104b may be operable to perform direct up-conversion of the baseband frequency signal to a RF signal. In some instances, the RF transmitter 104b may be operable to convert baseband signal components received from the digital baseband processor 108 from analog to digital before up conversion. In other instances, the RF transmitter 104b may receive baseband signal components in digital form. In various embodiments of the invention, the RF transmitter 104b may be operable to transmit cellular signals in accordance with cellular standards such as GSM and/or EDGE. In this regard, the RF transmitter 104b may be operable to generate signals, such as local oscillator signals, for the transmission and processing of cellular signals.

The digital baseband processor 108 may comprise suitable logic, circuitry, and/or code that may be operable to process and/or handle baseband frequency signals. In this regard, the digital baseband processor 108 may be operable to process or handle signals received from the RF receiver 104a and/or signals to be transferred to the RF transmitter 104b. The digital baseband processor 108 may also be operable to provide control and/or feedback information to the RF receiver 104a and to the RF transmitter 104b based on information from the processed signals. The digital baseband processor 108 may be operable to communicate information and/or data from the processed signals to the processor 110 and/or to the memory 112. Moreover, the digital baseband processor 108 may be operable to receive information from the processor 110 and/or to the memory 112, that may be processed and transferred to the RF transmitter 104b for transmission to the network.

The processor 110 may comprise suitable logic, circuitry, and/or code that may enable control and/or data processing operations for the wireless communication device 100. The processor 110 may be operable to control at least a portion of the RF receiver 104a, the RF transmitter 104b, the digital baseband processor 108, and/or the memory 112. In this regard, the processor 110 may be operable to generate at least one signal for controlling operations within the wireless communication device 100. The processor 110 may also be operable to execute applications that may be utilized by the wireless communication device 100. For example, the processor 110 may be operable to execute applications that may enable presenting and/or interacting with content received via RF signals in the wireless communication device 100.

The memory 112 may comprise suitable logic, circuitry, and/or code that may be operable to store data and/or other information utilized by the wireless communication device 100. For example, the memory 112 may be operable to store processed data generated by the digital baseband processor 108 and/or the processor 110. The memory 112 may also be operable to store information, such as configuration information, that may be utilized to control the operation of at least one block in the wireless communication device 100. For example, the memory 112 may comprise information necessary to configure the RF receiver 104a to enable receiving signals in the appropriate frequency band.

The power control module 114 may comprise suitable logic, circuitry, and/or code that may be operable to utilize closed loop power control to manage a transmit power of the device 100. In an exemplary embodiment of the invention, the power control module 114 may be implemented as a plurality of modules 114a, 114b, 114c, and 114d.

In an exemplary receive operation, the wireless communication device 100 may receive a cellular signal via the antenna 106. The RF receiver 104a may process the received signal and output a digital baseband signal to the baseband processor 108. The baseband processor 108, possibly utilizing the memory 112, may, for example, process the baseband signal and present content from the received signal to a user of the device 100. The processor 110, possibly utilizing the memory 112, may control the transfer of data between the RF receiver 104a and the baseband processor 108. The processor 110, possibly utilizing the memory 112, may control the processing of the signals by the RF receiver 104a and the baseband processor 108.

In an exemplary transmit operation, data may be read out from the memory 112 by the processor 110 and transferred to the baseband processor 108. The baseband processor 108 may process the data to generate a baseband signal. The baseband signal may be transferred to the RF transmitter 104b. The transmitter may convert the baseband signal to analog, up-convert the baseband signal to RF, and amplify the signal for output to the antenna 106. In regards to the amplification, the power control module 114 may be operable to utilize closed loop power control to maintain the transmit power at or within a tolerance of desired levels. In this regard, the power control module 114 may measure the output power of the transmitter 104a, compare a result of that measurement to a reference signal, and adjust a gain of a preamplifier based on a result of the comparison.

Figure 2A:
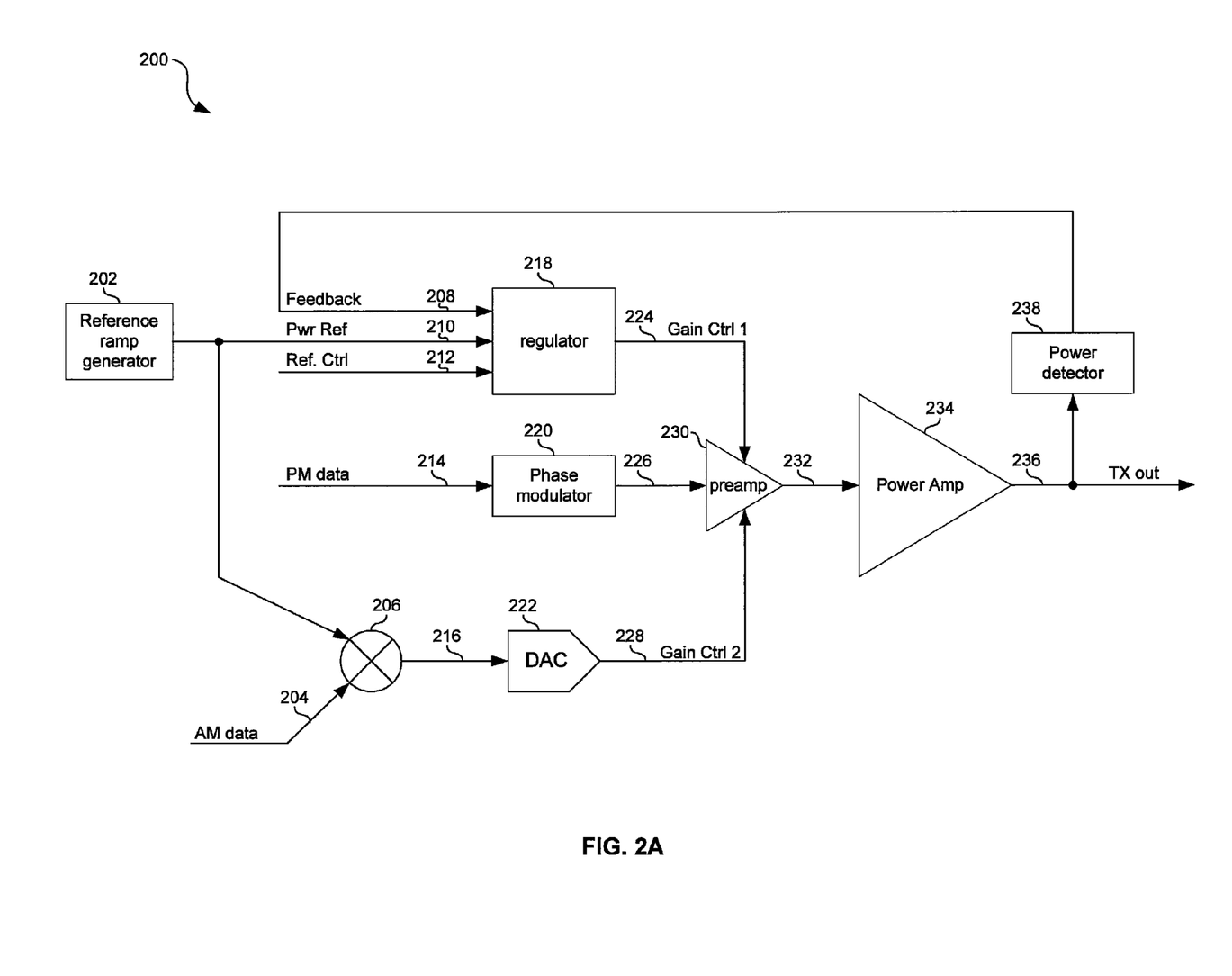
FIG. 2A is a block diagram of a portion of a transmit path of a wireless device operable to perform closed loop control of preamplifier gain, in accordance with an embodiment of the invention.

FIG. 2A is a block diagram of a portion of a transmit path of a wireless device operable to perform closed loop control of preamplifier gain, in accordance with an embodiment of the invention. Referring to FIG. 2A, there is shown a portion 200 of a transmit path of a wireless device comprising reference ramp generator 202, a multiplier 206, a regulator 218, a phase modulator 220, a digital-to-analog converter (DAC) 222, a preamplifier 230, a power amplifier 234, and a power detector 238.

The reference ramp generator 202 may comprise suitable logic, circuitry, and/or code that may be operable to generate a power reference signal 210 corresponding to ideal levels and/or ramping up and/or ramping down of transmit signal power. Signals communicated by the wireless device may be time division multiplexed and thus transmissions may occur in allocated timeslots. Accordingly the output power may be ramped up at the beginning of a timeslot to and/or ramped down at the end of a timeslot. The ramping may reduce spectral emissions that might occur if the power levels had abrupt transitions.

The multiplier 206 may comprise suitable logic, circuitry, and/or code that may be operable to generate a signal corresponding to the product of two or more input signals. In this manner, the power reference signal 210 may be multiplied with the amplitude modulation (AM) data signal 204 to generate a conditioned data signal 216 that, after conversion to an analog representation, may be utilized to amplitude modulate a signal to be transmitted by controlling gain of the preamplifier 230.

The regulator 218 may comprise suitable logic, circuitry, and/or code that may be operable to compare a feedback signal 208 with the power reference signal 210 and adjust the reference control word 212, as necessary, to generate a gain control signal 224. The gain control signal 224 may be a digital control word that may determine, at least in part, gain of the preamplifier 230.

The phase modulator 220 may comprise suitable logic, circuitry, and/or code that may be operable to generate a carrier signal and phase modulate the carrier signal by the phase modulation (PM) data signal 214 to generate the phase modulated signal 226.

The digital-to-analog converter (DAC) 222 may comprise suitable logic, circuitry, and/or code that may be operable to convert the digital conditioned data signal 216 to gain control signal 228. In some embodiments of the invention, the DAC 222 may comprise a $\Delta\Sigma$ modulator and one or more filters. Notwithstanding, in various embodiments of the invention, the preamplifier 230 may be operable to receive a digital gain control and the DAC 222 may be unnecessary.

The preamplifier 230 may comprise suitable logic, circuitry, and/or code that may be operable to apply a gain to a phase modulated signal 226. Moreover, variation of the gain of the preamplifier 230 may enable amplitude modulation of the signal 226 input to the preamplifier 230 to generate the amplitude and phase modulated signal 232. The amount of gain applied by the preamplifier 230 may be determined based on the gain control signals 224 and 228. In an exemplary embodiment of the invention, the gain control signal 224 may be a course gain control and the gain control signal 228 may be a fine gain control. For example, the gain control signal 224 may be operable to adjust the gain of the preamplifier 230 by up to 48 dB and the gain control signal 224 may be operable to adjust the gain of the preamplifier 230 by up to 6 dB.

The power amplifier 234 may comprise suitable logic, circuitry, and/or code that may be operable to amplify the amplitude and phase modulated signal 232 to generate the output signal 236. The output signal 236 may be conveyed to an antenna for transmission.

The power detector 238 may comprise suitable logic, circuitry, and/or code that may be operable to measure a strength of the signal 236. In this regard, the strength of the signal 236 may vary due to variations in, for example, process, voltage, temperature, and/or loading conditions. Thus, measuring the signal 236 via the power detector 238 may provide an accurate and reliable way to determine the actual output power. The power detector 238 may output a feedback signal 208 that may be an indication of the measured signal strength. In various exemplary embodiments of the invention, the feedback signal 208 may be output as a digital signal. Notwithstanding, the feedback signal 208 may be output as an analog signal and subsequently converted to a digital signal by an analog-to-digital converter (not shown).

In operation, PM data 214 may arrive at the phase modulator 220 from upstream of the portion 200 in the transmit path. The phase modulator 220 may modulate an RF carrier with the received PM data 214 to generate the phase modulated signal 226 that may be input to the preamplifier 230.

AM data may arrive from upstream of the portion 200 in the transmit path and may be multiplied with power reference signal 210 output by the reference ramp generator 202 to generate the conditioned data signal 216. FIG. 2C illustrates exemplary waveforms for the conditioned data signal 216. The DAC 222 may be operable to convert the conditioned data signal 216 to an analog representation that may be applied to a first gain control terminal of the preamplifier 230. In this manner, the gain of the preamplifier 230 may be adjusted corresponding to the conditioned data signal 216 and the preamplifier 230 may operate to amplitude modulate the phase modulated signal 226 to generate the amplitude and phase modulated signal 232.

A reference control word 212 may be received from upstream of the portion 200 in the transmit path. The reference control word may be generated, for example, by the processor 110 or the baseband processor 108 described with respect to FIG. 1. The reference control word 212 may be a nominal or ideal value to be applied to a second gain control terminal of the preamplifier 230. The reference control word 212 may, for example, be generated based on a factory setting or initial calibration. Accordingly, as one or more conditions and/or parameters vary, the reference control word 212 may need to be adjusted to account for the variations. In this regard, the regulator 218 may utilize the reference control word 212 as a baseline in generating the gain control signal 224, and the baseline value may be adjusted based on a comparison of the feedback signal 208 and the power reference signal 210. For the comparison, the power reference signal 210 may be time aligned to the feedback signal 208. In instances that signal strength of the power reference signal 210 is greater than signal strength of the feedback signal 208, the gain control signal 224 may be adjusted to increase the gain of the preamplifier 230. In instances that signal strength of the power reference signal 210 is less than signal strength of the feedback signal 208, the gain control signal 224 may be adjusted to decrease the gain of the preamplifier 230.

The amplitude and phase modulated signal 232 may be amplified by the power amplifier 234 to generate the output signal 236 that may be conveyed to an antenna for transmission and to the power detector 238 for generation of the feedback signal 208.

Figure 2B:
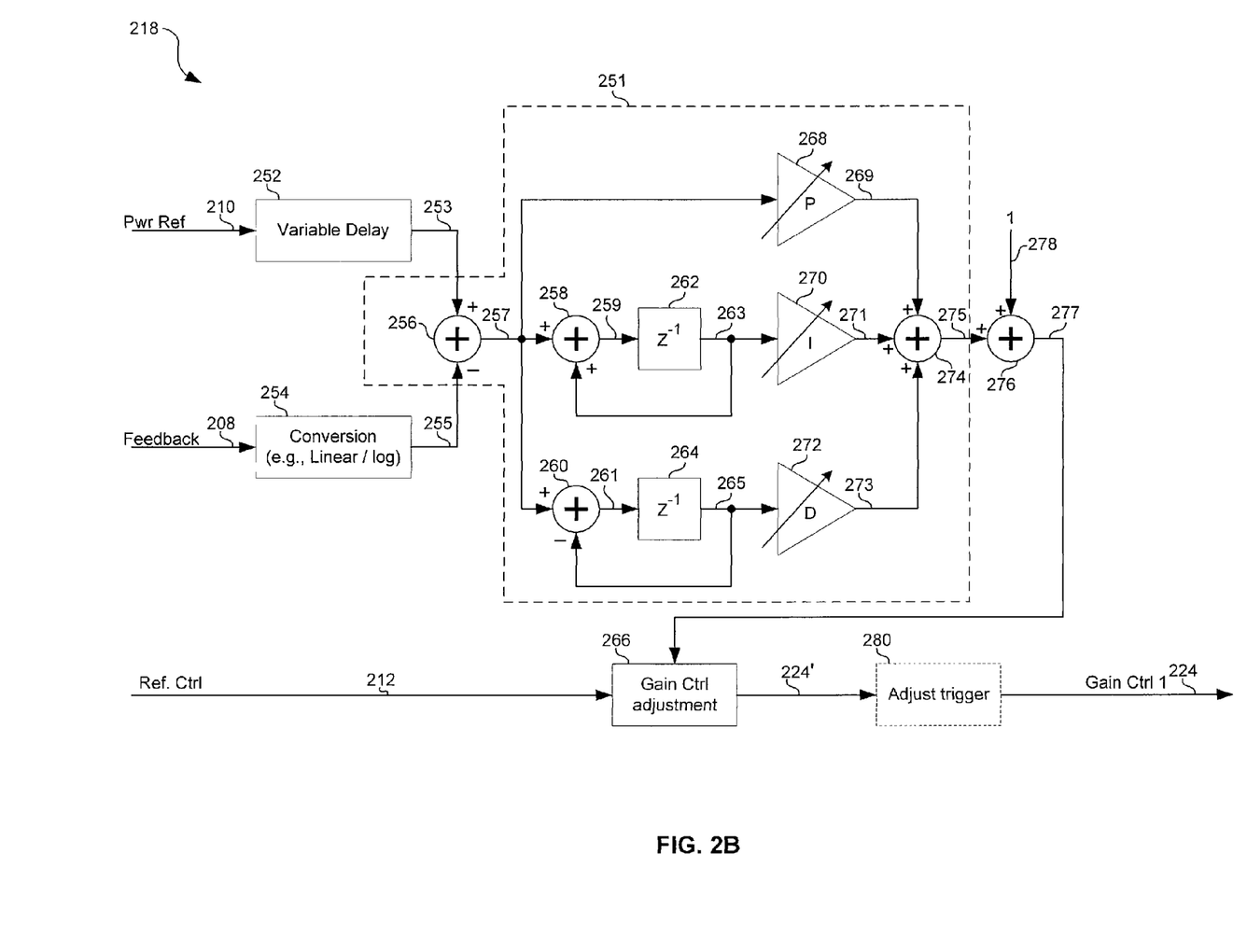
FIG. 2B is a block diagram illustrating an exemplary regulator utilized for closed loop power control, in accordance with an embodiment of the invention.
Figure 2C:
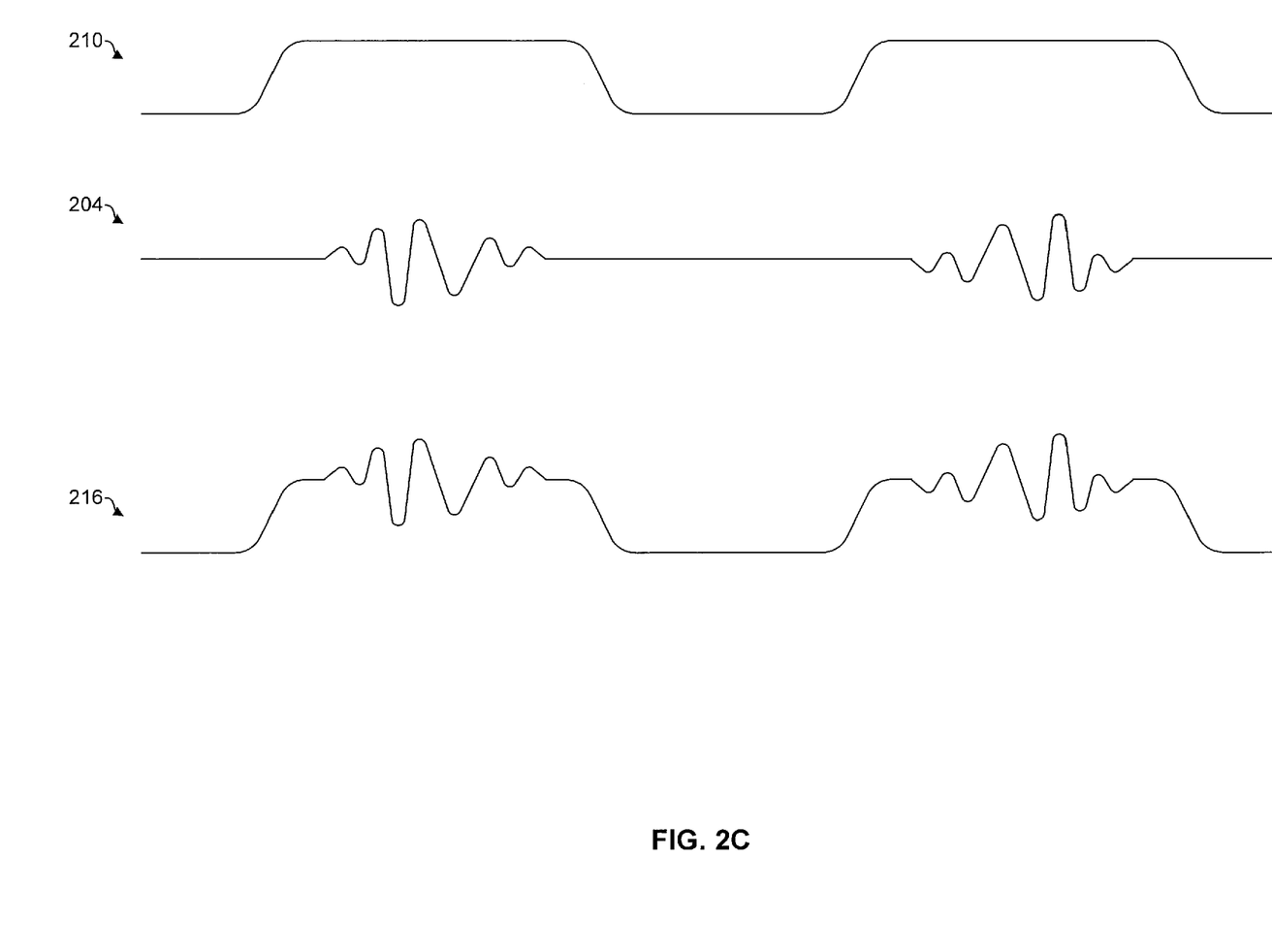
FIG. 2C illustrates exemplary waveforms, in accordance with an embodiment of the invention.

FIG. 2B is a block diagram illustrating an exemplary regulator utilized for closed loop power control, in accordance with an embodiment of the invention. Referring to FIG. 2B, the regulator 218 may comprise a variable delay module 252, a scale conversion module 254, a PID controller 251, an adder 276, a gain adjustment module 266. In various embodiments of the invention, the regulator 218 may additionally comprise a gain adjustment trigger 280.

The variable delay module 252 may comprise suitable logic, circuitry, and/or code that may be operable to apply a variable delay to the power reference signal 210. In this manner, variable delay module 252 may be operable to delay the power reference signal 210 such that the delayed power reference signal 253 is time aligned with the converted feedback signal 255.

The scale conversion module 254 may be operable to convert the value of the feedback signal 208 between different numbering scales to generate the converted feedback signal 255. In an exemplary embodiment of the invention, the scale conversion module 254 may be operable to convert between linear and logarithmic scales. In this regard, the feedback signal 208 may be converted such that the converted feedback signal 255 is based on the same numbering scale as the delayed power reference signal 253.

The adder 276 may comprise suitable logic, circuitry, and/or code that may be operable to combine two or more signals. Each of the signals 275 and 278, which are inputs to the adder 276, may be weighted and/or inverted prior to combining them to generate the error correction factor 277.

The proportional integral derivative (PID) controller 251 may comprise suitable logic, circuitry, and/or code that may be operable to generate an error correction factor 275 based on a difference or error between the delayed power reference signal 253 and the converted feedback signal 255. The PID controller 251 may comprise adders 256, 258, 260, and 274, delay blocks 262 and 264, and variable gain amplifiers 268, 270, and 272. The unit delay blocks 262 and 264 may be operable to delay the signals 259 and 261, respectively, by a sample period.

The variable gain amplifiers 268, 270, and 272 may comprise suitable logic, circuitry, and/or code that may be operable to generate correction terms 269, 271, and 273, respectively. A gain factor of each of the variable gain amplifiers 268, 270, and 272 may be determined by system designers and/or adjustable via, for example, one or more control signals from a processor. The contribution of the correction term 269 to the error correction factor 275 may be proportional to the present difference or error between the delayed power reference signal 253 and the converted feedback signal 255. The contribution of the correction term 271 to the error correction factor 275 may be proportional to the present difference or error between the delayed power reference signal 253 and the converted feedback signal 255. The contribution of the correction term 271 to the error correction factor 275 may also be proportional to the duration of the difference or error between the delayed power reference signal 253 and the converted feedback signal 255. The contribution of the correction term 273 to the error correction factor 275 may be proportional to the rate of change of the difference or error between the delayed power reference signal 253 and the converted feedback signal 255.

The gain adjustment module 266 may comprise suitable logic, circuitry, and/or code that may be operable to generate the gain control signal 224, or the signal 224' in instances that the gain adjustment trigger 280 is present, based on the reference control word 212 and the error correction factor 277. In this regard, the reference control word 212 may be adjusted by the error correction factor 277 to generate the gain control signal 224 (or 224').

The gain adjustment trigger 280 may comprise suitable logic, circuitry, and/or code that may be operable to adjust the gain control signal 224 in a single correction at the beginning of a transmit time slot, as opposed to a continuous or iterative correction over a portion of the time slot. In this regard, a value of the gain control signal 224 that may reduce the difference or error between the delayed power reference signal 253 and the converted feedback signal 255 may be calculated during a first transmit time slot and applied at the beginning of the next transmit time slot.

In operation, the power reference signal 210 may be delayed such that the delayed power reference signal 253 may be time aligned with the converted feedback signal 255. In this regard, since the power reference signal 210 and the feedback signals 208 are transient signals, time aligning them ensures that difference or error between the signals is a result of different amplitudes and not differences in timing. The conversion block may be operable to convert the feedback signals 208, if necessary, and output the converted feedback signal 255. The adder 256 may then generate the error signal 257 corresponding to the amplitude difference or error between the delayed power reference signal 253 and the converted feedback signal 255. The variable gain amplifier 268 may process the error signal 257 to generate the correction term 269. The adder 258, the delay block 262, and the variable gain amplifier 270 may process the error signal 257 to generate the correction term 271. The adder 260, the delay block 264, and/or the variable gain amplifier 272 may process the error signal 257 to generate the correction term 273. The correction terms 269, 271, and 273 may be combined by the adder 274 to generate the error correction factor 275 that may then be combined with a constant value of 1 by the adder 276 to generate the error correction factor 277. The gain adjustment module 266 may apply the error correction factor 277 to the reference control word 212 to generate the gain control signal 224, or 224'. In this regard, the signal 224' may correspond to instances that the gain adjustment trigger 280 is present and the gain control word 224 is to be adjusted in a single adjustment at the beginning of the next transmit time slot.

FIG. 2C illustrates exemplary waveforms, in accordance with an embodiment of the invention. Referring to FIG. 2C, there is shown an exemplary portion of a power reference signal 210, an AM data signal 204, and a conditioned data signal 216. This signals 210, 204, and 216 may be as described with respect to FIG. 2A.

Figure 2D:
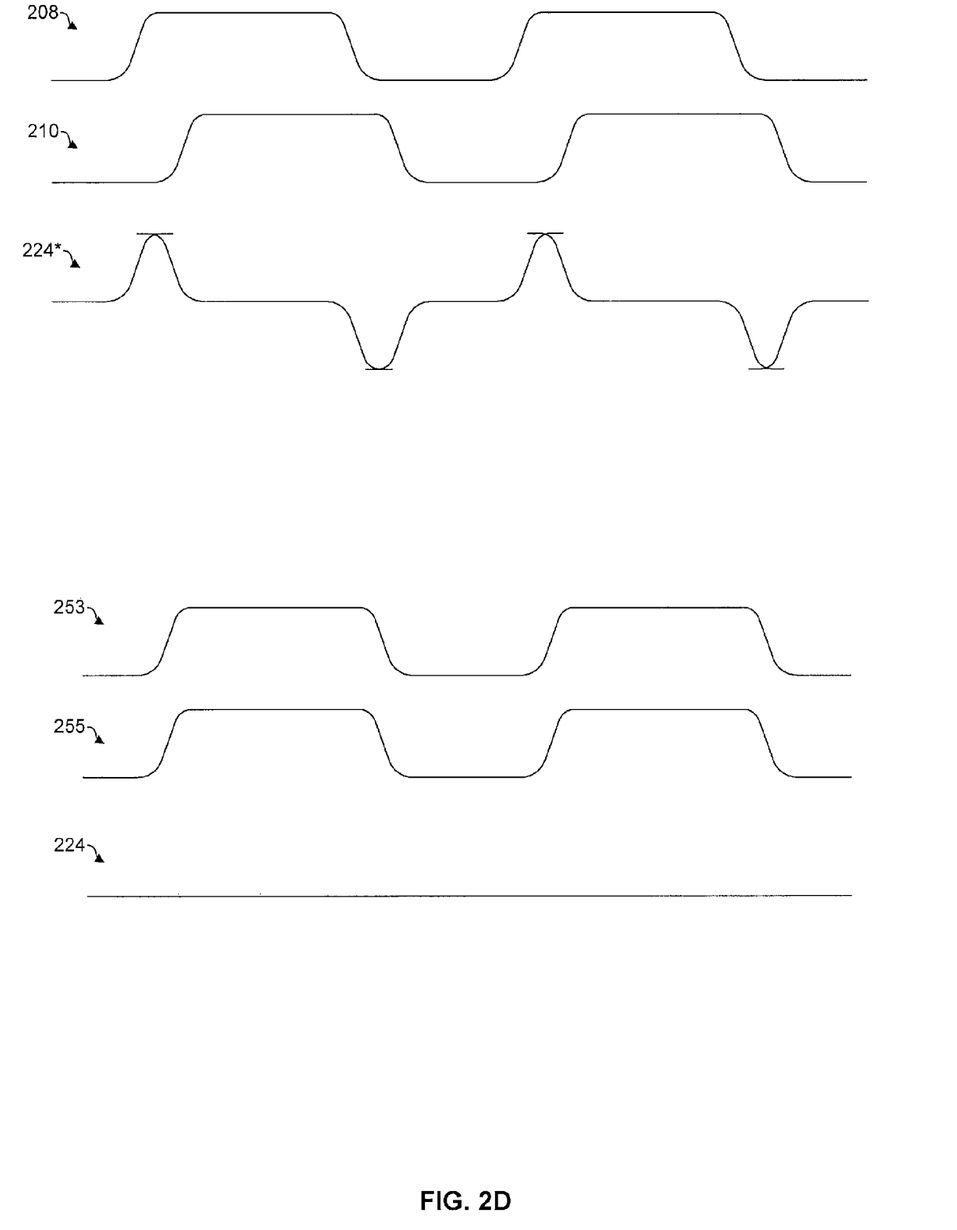
FIG. 2D illustrates time alignment of a feedback signal and a power reference signal in accordance with an embodiment of the invention.

FIG. 2D illustrates time alignment of a feedback signal and a power reference signal in accordance with an embodiment of the invention. Referring to FIG. 2D there is shown signals 208 and 210 that are of equal amplitude but are not time aligned. Accordingly, the waveform 224\* illustrates what the difference or error signal 224 would look like if the signals were compared without first aligning them. In this regard, the waveform 224\* erroneously indicates an amplitude difference between the signals 208 and 210. Conversely, the signals 253 and 255 are of equal amplitude and are time aligned. Thus, the difference or error signal 224 correctly indicates no difference or error.

Figure 3A:
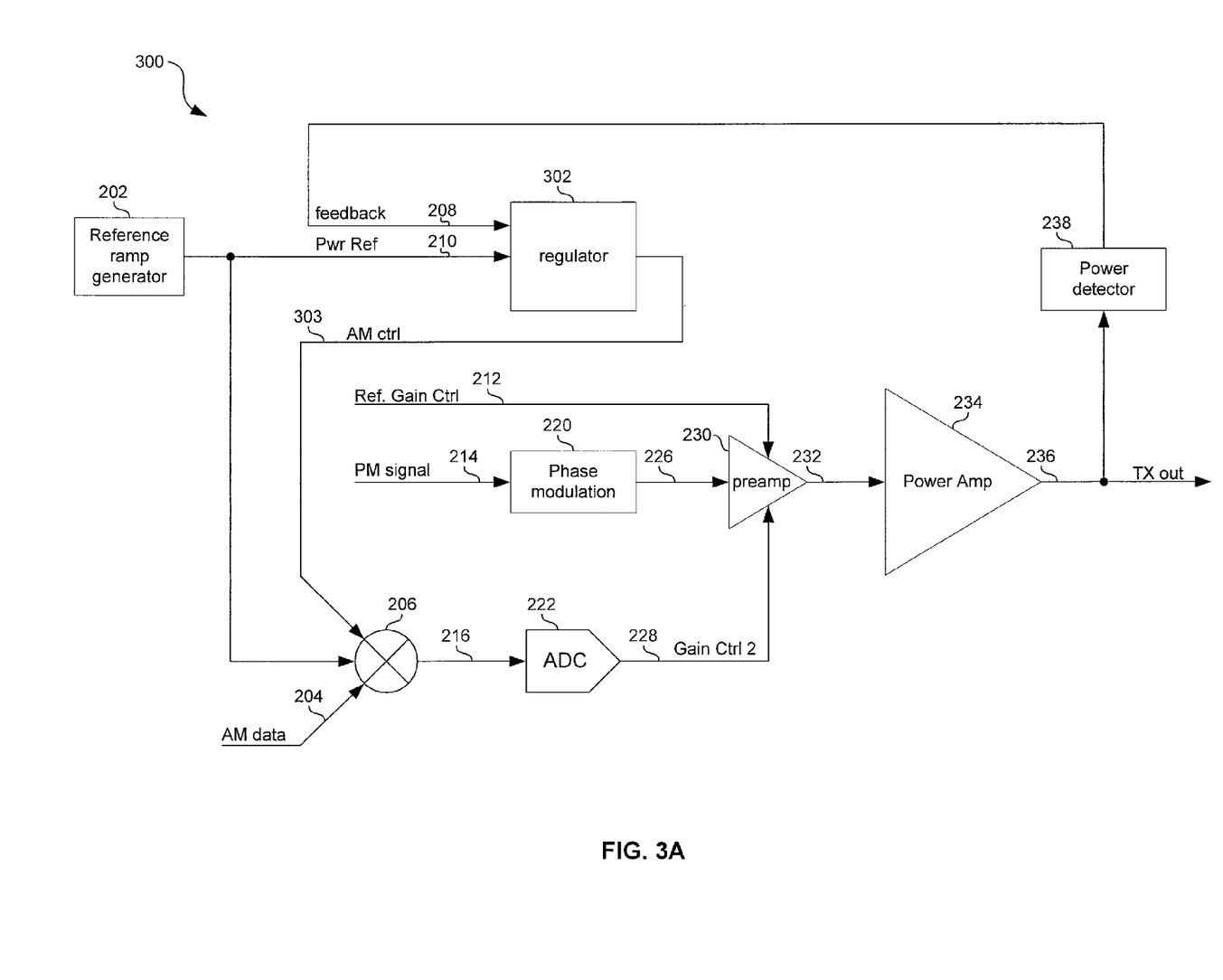
FIG. 3A is a block diagram of a portion of a transmit path of a wireless device operable to perform closed loop control of amplitude modulation levels, in accordance with an embodiment of the invention.

FIG. 3A is a block diagram of a portion of a transmit path of a wireless device operable to perform closed loop control of amplitude modulation levels, in accordance with an embodiment of the invention. Referring to FIG. 3A, the portion 300 of a transmit path is similar to the portion 200 of a transmit path described with respect to FIG. 3A. A first difference between the portion 300 and the portion 200 described with respect to FIG. 2A is that the reference control word 212 is applied to the second control terminal of the preamplifier 230. A second difference is that the regulator 303 differs from the regulator 218. In this regard, the regulator 302 outputs a signal 303 that scales the conditioned data signal 216.

In operation, the regulator 302 may be operable to determine the amplitude difference or error between the feedback signal 208 and the power reference signal 210 and generate the AM control signal 303 to compensate for the difference or error. The AM control signal 303 may be input to the multiplier 206 to scale the conditioned data signal 216. In this regard, in instances that the feedback signal 208 has lower amplitude than the power reference signal 210, then the AM ctrl signal 303 may be adjusted to scale the conditioned data signal 216 such that gain of the preamplifier 230 is increased. Conversely, in instances that the feedback signal 208 has larger amplitude than the power reference signal 210, then the AM ctrl signal 303 may be adjusted to scale the conditioned data signal 216 such that the gain of the preamplifier 230 is decreased.

Figure 3B:
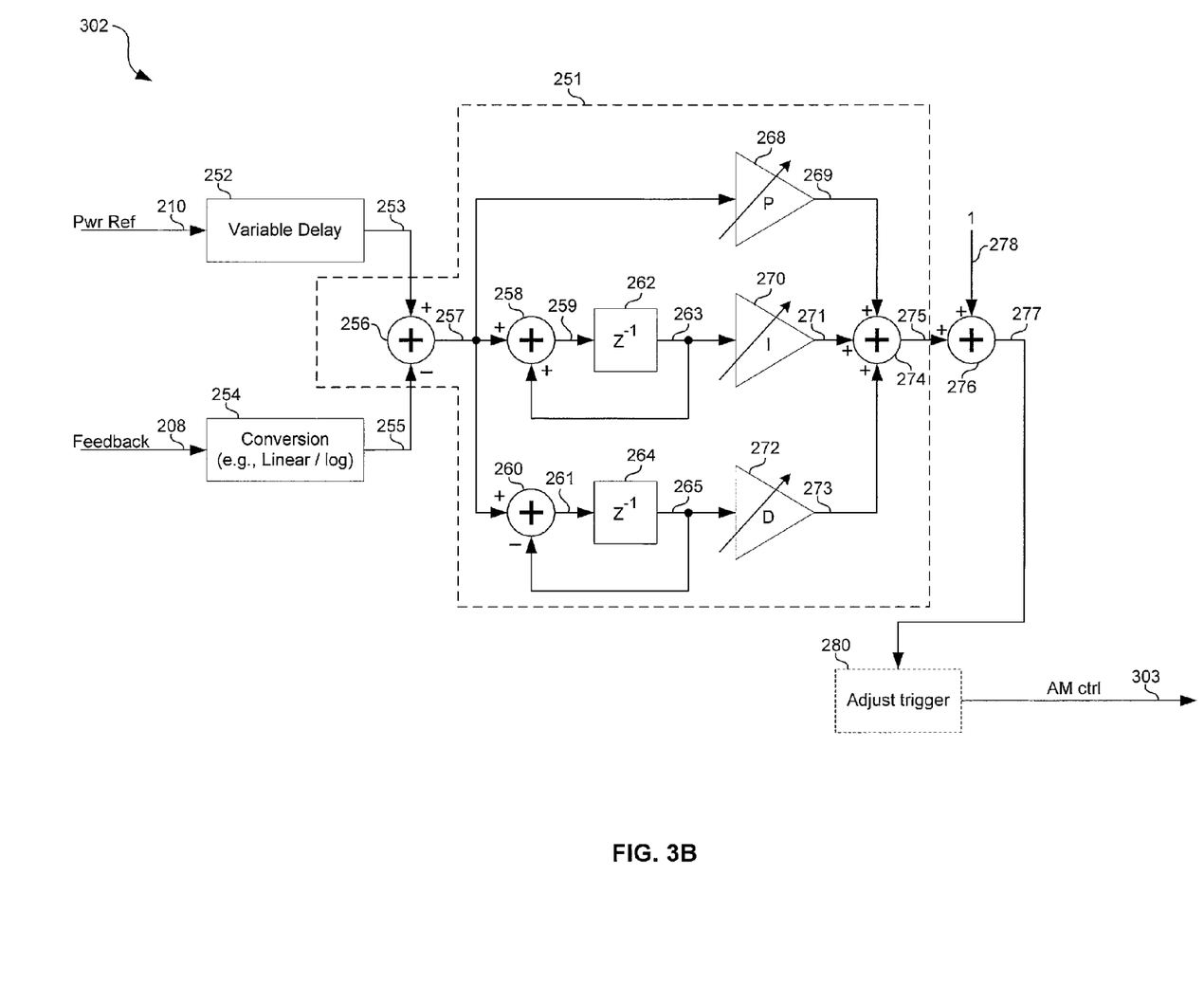
FIG. 3B is a block diagram illustrating an exemplary regulator utilized for closed loop power control, in accordance with an embodiment of the invention.

FIG. 3B is a block diagram illustrating an exemplary regulator utilized for closed loop power control, in accordance with an embodiment of the invention. The regulator 302 may be similar to the regulator 218 described with respect to FIG. 2B. A difference between the regulator 303 and the regulator 218 described with respect to FIG. 2B is that the regulator 303 may generate an AM control signal 303 that is applied to the multiplier 206 described with respect to FIG. 3A. In this regard, the output 303 of the regulator 302 adjusts the level of the conditioned data signal 216 rather than adjusting the control word applied to the first control terminal of the preamplifier 230.

Figure 4:
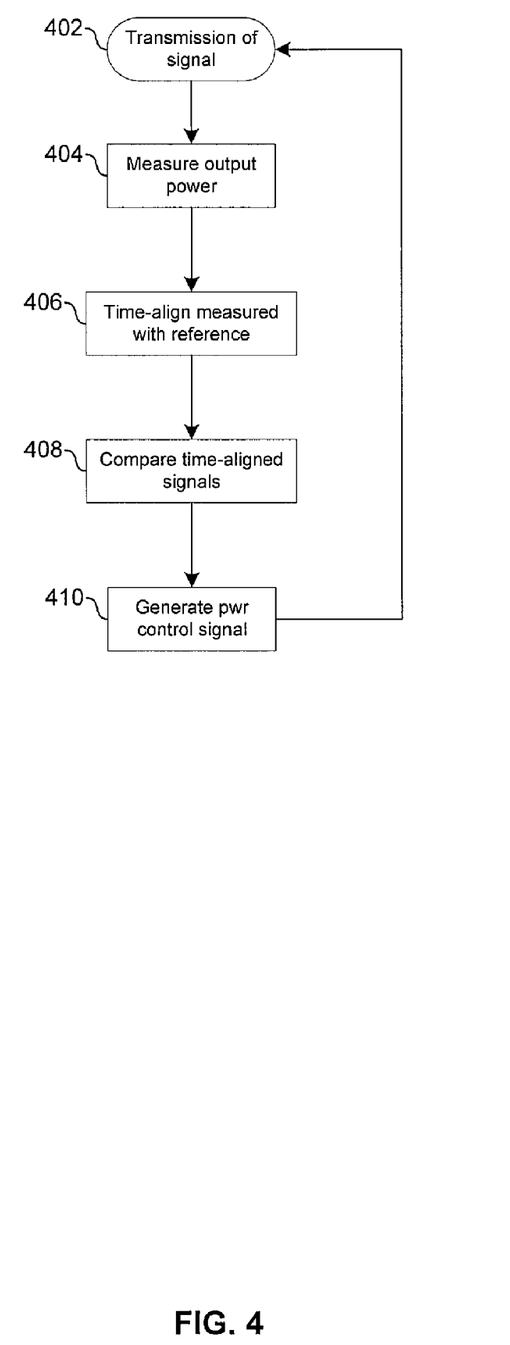
FIG. 4 is a flowchart illustrating exemplary steps for closed loop power control in a wireless system, in accordance with an embodiment of the invention.

FIG. 4 is a flowchart illustrating exemplary steps for closed loop power control in a wireless system, in accordance with an embodiment of the invention. Referring to FIG. 4, the exemplary steps may begin with step 402 when a wireless device such as the device 100 has a signal to transmit during a transmit time slot. Subsequent to step 402, the exemplary steps may advance to step 404.

In step 404, the transmitted or output signal strength may be measured. In this regard, the output power may be measured utilizing, for example, and envelope detector or more advanced techniques such as fast Fourier transform (FFT). The measured output power may be digitized and fed back for comparison with a power reference signal. Subsequent to step 404, the exemplary steps may advance to step 406.

In step 406, the power reference signal may be delayed such that the resulting delayed signal is time-aligned with the fed back digitized power measurement. For example, for transmission in time slots, time-aligning the signals ensures that the power of the transmitted signal at time t of a time slot is compared to the nominal or ideal power at time t of a time slot. Subsequent to step 406, the exemplary steps may advance to step 408.

In step 408, the time aligned signals may be compared to determine a difference or error between the reference signal and the transmitted or output signal. Subsequent to step 408, the exemplary steps may advance to step 410.

In step 410, the result of the comparison of step 408 may be utilized to generate a control signal that may, for example, be applied to a second gain control terminal of a preamplifier or applied to a multiplier to scale a conditioned data signal. Subsequent to step 410 the exemplary steps may return to the previously described step 402 and the steps may repeat for the next transmit time slot.

Various aspects of a method and system for closed loop power control in wireless systems are provided. In various exemplary embodiments of the invention, an output power of an amplifier 234 may be measured and an indication 208 of the measured power may be compared to a reference signal 210. The results of the comparison may be utilized to generate an error correction factor 277. The gain of a preamplifier 230 may be adjusted utilizing the error correction factor 277, wherein the output of the preamplifier 230 may be input to the amplifier 234. The error correction factor 277 may be generated via a proportional integral derivative (PID) controller 251. The gain of the preamplifier 230 may be adjusted via at least one control signal, wherein at least control signal 224 may be generated based on a reference control word 212 and the error correction factor 277. The indication 208 of the measured power and the reference signal 210 may be time aligned. The time alignment may be achieved by delaying one or both of the reference signal 208 and the indication 210 of the measured power. The gain of the preamplifier 230 may be adjusted via two gain terminals. The output of the preamplifier 230 may be amplitude modulated via a control signal 228. The reference signal 210 may be ramped up during a first portion of a transmit time slot and ramped down during a second portion of a transmit time slot. The error correction factor 277 may be generated during a first transmit time slot and utilized to adjust the gain of the preamplifier during a subsequent time slot. A signal 228 that amplitude modulates the output of the preamplifier 230 may be scaled to adjust the gain of the preamplifier.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for closed loop power control in wireless systems.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for wireless communications the method comprising:
   receiving an indication of a measured output power of an amplifier;
   generating an error correction factor by comparing said indication to a reference signal, wherein said indication and said reference signal are time aligned;
   generating a conditioned data signal by multiplying said reference signal with a signal having an amplitude corresponding to a data signal; and
   adjusting a gain of a preamplifier based on at least one of said error correction factor and said conditioned data signal, wherein an output of said preamplifier is an input of said amplifier.

2. The method according to claim 1, further comprising generating said error correction factor via a proportional integral derivative controller.

3. The method according to claim 1, further comprising adjusting said gain of said preamplifier via at least one gain control signal.

4. The method according to claim 3, wherein said at least one gain control signal is generated based on a reference control word and said error correction factor.

5. The method according to claim 1, further comprising delaying one or both of said reference signal and said indication such that they are time aligned.

6. The method according to claim 1, further comprising adjusting said gain of said preamplifier via two gain control terminals.

7. The method according to claim 6, further comprising amplitude modulating, said output of said preamplifier via one of said two gain control terminals.

8. The method according to claim 1, further comprising:
generating said error correction factor during a first transmit time slot; and
during a subsequent time slot, adjusting said gain of said preamplifier utilizing said correction factor generated during said first transmit time slot.

9. The method according to claim 1, further comprising generating, a scaled conditioned data signal by multiplying said conditioned data signal by said error correction factor, wherein said adjusting a gain of a preamplifier comprises adjusting said gain of said preamplifier based on said scaled conditioned data signal.

10. The method according to claim 1, wherein said reference signal ramps up during a first portion of a transmit time slot and ramps down during a second portion of said transmit time slot.

11. A system for wireless communications, the system comprising:
one or more circuits operable to:
receive an indication of a measured output power of an amplifier;
generate an error correction factor by comparing said indication to a reference signal, wherein said indication and said reference signal are time aligned;
generate a conditioned data signal by multiplying said reference signal with a signal having an amplitude corresponding to a data signal; and
adjust a gain of a preamplifier based on at least one of said error correction factor and said conditioned data signal, wherein an output of said preamplifier is an input of said amplifier.

12. The system according to claim 11, wherein said one or more circuits are further operable to generate said error correction factor via a proportional integral derivative controller.

13. The system according to claim 11, wherein said one or more circuits are further operable to adjust said gain of said preamplifier via at least one gain control signal.

14. The system according to claim 13, wherein said at least one gain control signal is generated based on a reference control word and said error correction factor.

15. The system according to claim 11, wherein said one or more circuits are further operable to delay one or both of said reference signal and said indication such that they are time aligned.

16. The system according to claim 11, wherein said one or more circuits are further operable to adjust said gain of said preamplifier via two gain control terminal.

17. The system according to claim 16, wherein said one or more circuits are further operable to amplitude modulate said output of said preamplifier via one of said two gain control terminals.

18. The system according to claim 11, wherein said one or more circuits are further operable to:
generate said error correction factor during a first transmit time slot; and
during a subsequent time slot, adjust said gain of said preamplifier utilizing said correction factor generated during said first transmit time slot.

19. The system according to claim 11, wherein said one or more circuits are further operable to generate a scaled conditioned data signal by multiplying said conditioned data signal by said error correction factor, wherein said adjusting a gain of a preamplifier comprises adjusting said gain of said preamplifier based on said scaled conditioned data signal.

20. The system according to claim 11, wherein said reference signal ramps up during a first portion of a transmit time slot and ramps down during a second portion of said transmit time slot.

* * * * *